US006617187B1

(12) United States Patent
Shimabukuro et al.

(10) Patent No.: US 6,617,187 B1
(45) Date of Patent: *Sep. 9, 2003

(54) METHOD FOR FABRICATING AN ELECTRICALLY ADDRESSABLE SILICON-ON-SAPPHIRE LIGHT VALVE

(75) Inventors: Randy L. Shimabukuro, San Diego, CA (US); Stephen D. Russell, San Diego, CA (US); Bruce W. Offord, San Diego, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/880,660

(22) Filed: Aug. 3, 2001

Related U.S. Application Data

(60) Division of application No. 09/047,658, filed on Mar. 25, 1998, now Pat. No. 6,312,968, which is a continuation-in-part of application No. 08/301,170, filed on Sep. 1, 1994, now abandoned, which is a continuation-in-part of application No. 08/105,252, filed on Aug. 9, 1993, now abandoned, which is a continuation-in-part of application No. 08/094,541, filed on Jun. 30, 1993, now Pat. No. 5,300,443.

(51) Int. Cl.$^7$ .............................................. H01L 21/00
(52) U.S. Cl. ...................... 438/30; 438/149; 438/164
(58) Field of Search .......................... 438/30, 164, 165, 438/166, 149, 155

(56) References Cited

U.S. PATENT DOCUMENTS 4,024,626 A * 5/1977 Leupp et al. ................. 438/30
4,177,084 A * 12/1979 Lau et al. ..................... 118/8
4,509,990 A * 4/1985 Vasudev ..................... 438/166
4,615,762 A * 10/1986 Jastrzebski et al. ......... 438/412
4,694,347 A * 9/1987 Ito ............................. 348/794
5,256,562 A * 10/1993 Vu et al. ..................... 438/30
6,190,933 B1 * 2/2001 Shimabukuro et al. ....... 438/30
6,312,968 B1 * 11/2001 Shimabukuro et al. ....... 438/30

OTHER PUBLICATIONS

Noguchi et al "Grain Growth and Conductive Characteristics of Super Thin Polysilicon Films by Oxidation", Japanese Journal of Applied Physics, Part 2 (Letters), Jun. 1985, vol. 24, No. 6, pp L434–L436.*

* cited by examiner

*Primary Examiner*—Michael Trinh
(74) *Attorney, Agent, or Firm*—Michael A. Kagan; James A. Ward; Peter A. Lipovsky

(57) ABSTRACT

A method for fabricating a monolithically integrated liquid crystal array display and control circuitry on a silicon-on-sapphire structure comprises the steps of: a) forming an epitaxial silicon layer on a sapphire substrate to create a silicon-on-sapphire structure; b) ion implanting the epitaxial silicon layer; c) annealing the silicon-on sapphire structure; d) oxidizing the epitaxial silicon layer to form a silicon dioxide layer from portion of the epitaxial silicon layer so that a thinned epitaxial silicon layer remains; e) removing the silicon dioxide layer to expose the thinned epitaxial silicon layer; f) fabricating an array of pixels from the thinned epitaxial silicon layer; and g) fabricating integrated circuitry from the thinned epitaxial silicon layer which is operably coupled to modulate the pixels. The thinned epitaxial silicon supports the fabrication of device quality circuitry which is used to control the operation of the pixels.

16 Claims, 9 Drawing Sheets

METHOD FOR FABRICATING AN ELECTRICALLY ADDRESSABLE SILICON-ON-SAPPHIRE LIGHT VALVE

CROSS REFERENCE TO RELATED APPLICATIONS

This application is a continuation-in-part of U.S. patent application Ser. No. 08/301,170 (Navy Case No. 74146) filed Sep. 1, 1994, entitled *Method for Fabricating Electrically Addressable Silicon-On-Sapphire Light Valve*, now abandoned, which is a continuation-in-part of U.S. patent application Ser. No. 08/105,252 (Navy Case No. 73,925) filed Aug. 9, 1993, entitled *Ultra-high Resolution Liquid Crystal Display on Silicon-On-Sapphire*, now abandoned which is a continuation-in-part of U.S. patent application Ser. No. 08/094,541 filed Jun. 30, 1993, now U.S. patent application Ser. No. 5,300,443, and is a divisional of U.S. patent application Ser. No. 09/047,658 (Navy Case No. 79029) filed Mar. 25, 1998, entitled *Method for Fabricating an Electrically Addressable Silicon-On-Sapphire Light Valve*, now U.S. Pat. No. 6,312,968.

BACKGROUND OF THE INVENTION

Liquid crystal displays are used in a wide variety of commercial applications including portable (laptop) computers, wristwatches, camcorders and large screen televisions. Liquid crystal light valves, used as spatial light modulators, may be used in projection systems as well as optical computing applications. Limitations inherent in the existing technology come from the necessity of fabricating the displays on transparent glass or quartz substrates which are not amenable to high quality electronic materials. Fabrication of displays on bulk silicon, although of high crystal quality, unnecessarily constrains the display to reflective mode schemes due to the opaque substrate and is not applicable to transmissive applications. The ability to integrate drive circuitry using thin-film transistors (TFTs) with liquid crystal displays has improved reliability and has allowed the use of this technology in lightweight, portable applications. However, the integration of display driving circuitry has been substantially limited to thin film transistor technology using amorphous (a-Si) or polycrystalline (p-Si) silicon deposited on glass or quartz substrates. Lattice and thermal mismatch between the silicon layer and the substrate, and the low temperature deposition techniques used in the a-Si and p-Si technologies result in a silicon layer with poor charge carrier mobility and crystallographic defects. These limitations are directly related to inferior electronic device performance and limitations when compared to bulk silicon.

Of particular importance for integrated display systems is the desire for higher density circuitry for ultra-high resolution display and light valve applications and for the monolithic integration of display driver circuitry and related signal processing circuitry on-chip. The characteristic lower (electrical and crystallographic) qualities of a-Si and p-Si materials result in poor fabrication yields when compared to conventional Very Large Scale Integration (VLSI) processing. Overcoming this problem generally requires the use of redundant circuit elements in each pixel to ensure fully functional displays. This redundancy requires an concomitant increase in pixel size, thereby preventing the manufacture of ultra-high resolution liquid crystal displays. The additional circuit elements also reduce the aperture ratio, i.e. the fraction of pixel area allowing transmitted light, thereby reducing the brightness of the display, or light valve.

Furthermore, low carrier mobility, low speed, low yield a-Si and p-Si materials are incompatible with VLSI design and fabrication techniques which would otherwise allow integration of video drivers, digital logic and other computational circuitry on-chip thereby offering designers greater functionality, higher reliability, and improved performance.

B. Bahadur, editor, *Liquid Crystals: Applications and Uses*, Vol. 1, World Scientific, New Jersey, 1990, pp. 448–451 reviews the state of the art in active matrix displays for projection display applications. Active-matrix displays use one or more nonlinear circuit elements, e.g. TFTs or diodes, to switch the liquid crystal capacitor in each pixel. Among the materials discussed for these applications includes silicon-on-sapphire (SOS). The authors state recognized limitations of SOS on page 450 "although SOS devices have excellent performance in terms of drive current and speed, they have leakage currents which are too high for use in an active matrix display." Excessive leakage results in a drop in voltage across the liquid crystal capacitor which, in the case of commonly used nematic liquid crystals, results in a change in orientation and gray level.

Thus, a continuing need exists for an electrically addressable ultra-high resolution nematic liquid crystal display or light valve system which monolithically integrates an active matrix display with its associated drive and image processing circuitry.

SUMMARY OF THE INVENTION

The present invention provides a method for fabricating a monolithically integrated liquid crystal display array and control circuitry on an ultra-thin epitaxial silicon layer which comprises a silicon-on-sapphire structure. The method comprises the steps of: a) forming an epitaxial silicon layer on a sapphire substrate to create a silicon-on-sapphire structure; b) ion implanting the epitaxial silicon layer; c) annealing the silicon-on sapphire structure; d) oxidizing the epitaxial silicon layer to form a silicon dioxide layer from a portion of the epitaxial silicon layer so that a thinned epitaxial silicon layer remains; e) removing the silicon dioxide layer to expose the thinned epitaxial silicon layer; f) fabricating an array of pixels from the thinned epitaxial silicon layer; and g) fabricating integrated circuitry from the thinned epitaxial silicon layer which is operably coupled to modulate the pixels. The thinned epitaxial silicon supports the fabrication of device quality circuitry which is used to control the operation of the pixels.

DISCLOSURE OF THE PREFERRED EMBODIMENT

Figure 1:
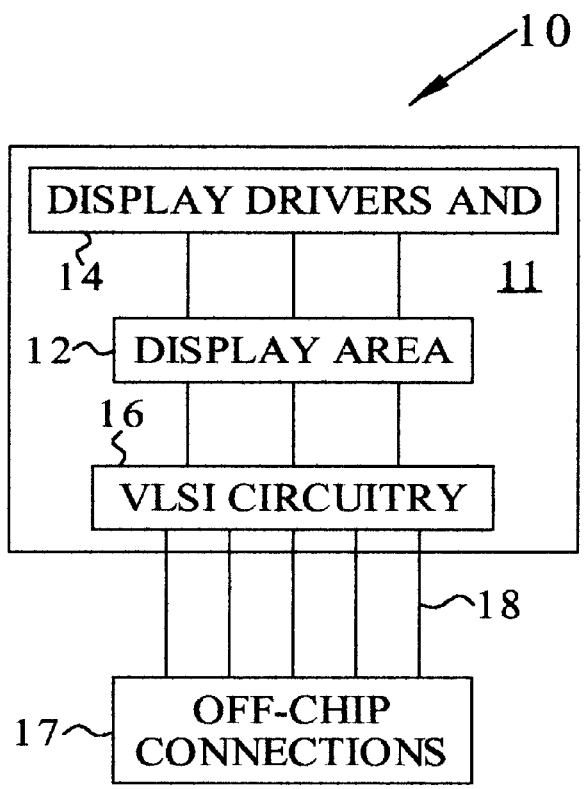
FIG. 1 schematically shows a nematic liquid crystal display monolithically integrated with associated circuitry on an improved-UTSOS wafer.

Referring to FIG. 1, the present invention provides a method for fabricating an integrated display system 10 comprising a nematic liquid crystal display monolithically integrated with associated drive circuitry and image processing electronics on an improved, ultrathin siliconon-sapphire (UTSOS) wafer 11. One advantage of the method for fabricating display system 10 is the fabrication of devices and circuits in a thinned epitaxial silicon layer (ultrathin silicon-on-sapphire or UTSOS). Electronic devices and circuits can be operated in a fully depleted mode and do not require body ties for improved performance and design. The thinner crystalline silicon layer of the invention is also important for projection applications since the thinner silicon absorbs less light and the devices will have lower light-induced leakage currents. Furthermore, the ultra-thin silicon layers of the herein disclosed and claimed invention assure reduced carrier lifetime and reduced light-induced leakage compared to similarly dimensioned bulk silicon layers. The invention does not exhibit decreased current in the saturation region, a phenomenon known as self heating, which occurs on silicon dioxide or glass substrates.

FIG. 1 schematically shows a display system 10 having the top view nematic liquid crystal display 12 monolithically integrated with associated circuitry 14 and 16 on an improved-UTSOS wafer. Schematically this arrangement appears to be similar to the co-pending patent application by Shimabukuro et al. entitled "Ultra-High Resolution Liquid Crystal Display On Silicon-On-Sapphire", U.S. Patent and Trademark Application Ser. No. 08/105,252 (Navy Case No. 73,925), incorporated herein by reference. A display area 12 in display or light valve system 10 has an array of picture elements (pixels) which provide the image for viewing or projection. In the preferred embodiment, a 1000 pixel×1000 pixel backlit display or projection light valve is described. However, the teachings within may be used to fabricate ultra-high resolution displays with larger pixel counts. At the periphery of the display area and electrically connected to the array of pixels is display driver circuitry 14 which supplies appropriate voltages to the display rows and columns of pixels to address individual pixels which provide the image for viewing. This location and interconnection allow full electrical addressing of the display or light valve and a monolithic integration for improved reliability and performance.

Display driver circuitry 14 employs complementary metal-oxide-semiconductor (CMOS) technology. Additional VLSI signal processing, buffering, data decompression circuitry 16 and the like may also be integrated around a perimeter area of the display. Means for the data (image) signal voltages to be delivered onto the monolithically integrated wafer from off-chip (wafer) connections 17, such as, appropriate leads, connectors and waveguides 18 is also provided to complete the display or light valve system. Untethered communications may be also implemented if desired. Untethered communications includes any form of electromagnetic input or output of information, including but not limited to radio frequency (RF), microwave, and optical data links.

Figure 2:
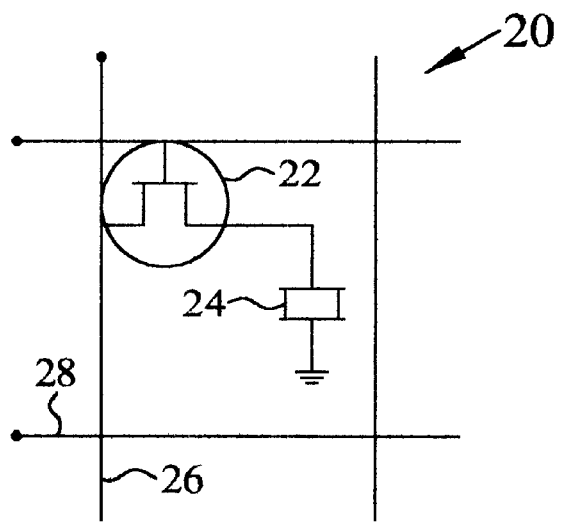
FIG. 2 shows the electrical schematic for a single picture element (pixel).

FIG. 2 shows an electrical schematic for a single picture element or pixel 20. Pixel 20 includes a single nonlinear circuit element 22, such as a MOSFET, and a single nematic liquid crystal capacitor 24. Metal column line 26 and polysilicide row line 28 are appropriately connected to bias the MOSFET to vary the voltage on the nematic liquid crystal within the capacitor 24 to achieve the desired gray scale.

In the prior art, multiple nonlinear elements (TFT, MOSFET, or diode or the like) are used to provide satisfactory fabrication yields. The improved UTSOS material provides a single crystal silicon material in which highly reliable MOSFETs can be fabricated eliminating the requirement for redundancy. This capability results in an important reduction in the actual size of each pixel element compared to the prior art which results in substantial improvements in display density and brightness. Also, small nonlinear circuit elements (MOSFETs) can be fabricated on the UTSOS silicon layer which will achieve the same output current characteristics of larger TFTs due to the improved single-crystal structure, which provides for improved pixel scalability and aperture ratio.

Figure 3:
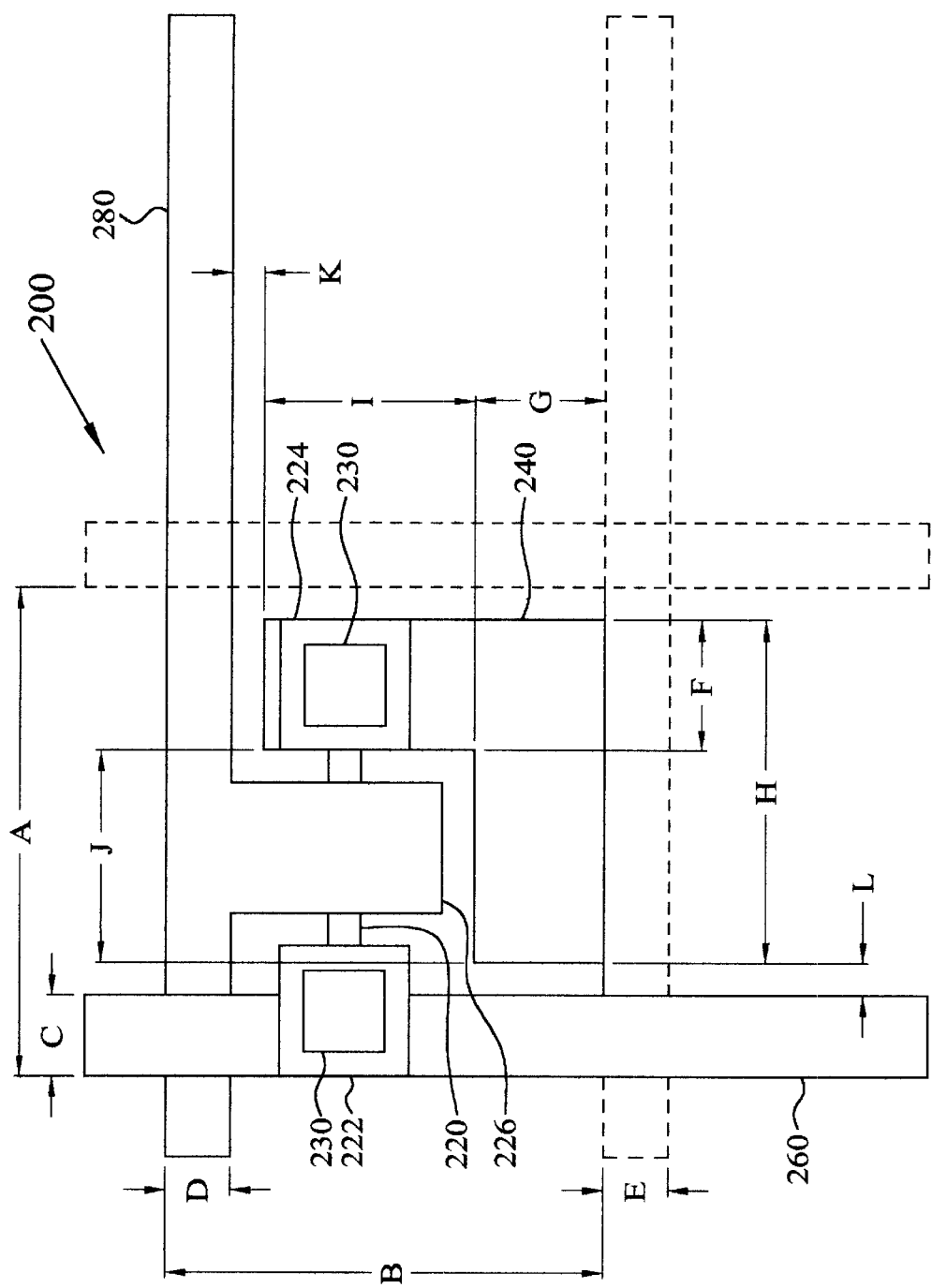
FIG. 3 shows the layout scheme for a single pixel.

FIG. 3 shows in detail the layout scheme for a single pixel 200 in accordance with this invention. A capacitor structure 240 is shown with a total area of less than 53 square microns, while the MOSFET 220 covers less than 70 square microns. A 2 micron wide polysilicide gate line 280 is electrically connected to gate structure 226 of the MOSFET to turn on or off the transistor as desired. A 2 micron wide metal data line 260 is electrically connected to MOSFET source 222, while the MOSFET drain 224 is electrically connected to nematic liquid crystal capacitor structure 240. Two micron contact holes 230 are used to electrically couple these structures together. Nematic liquid crystal capacitor structure 240 contains the nematic liquid crystal material (not shown in this figure) that undergoes variable switching in response to voltages applied to the capacitor structure that is consequently formed between laminae of the structure.

Typically, an entire pixel 200 is sized to be confined within a 12 micron by 12 micron area, and has a 37% aperture ratio. Exemplary dimensions may be: dimensions A and B equal to 12.0 microns, dimensions C, D, and E equal to 2.0 microns, dimensions F and G equal to 3.6 microns, dimension H equal to 8.8 microns, dimension I equal to 5.8 microns, dimension J equal to 5.2 microns and dimensions K and L equal to 0.6 microns. An advantage of this practical, simplified structure is the ready scalability of the structure. However, it is to be understood that other dimensions may be used to increase the aperture ratio as desired.

Figure 4:
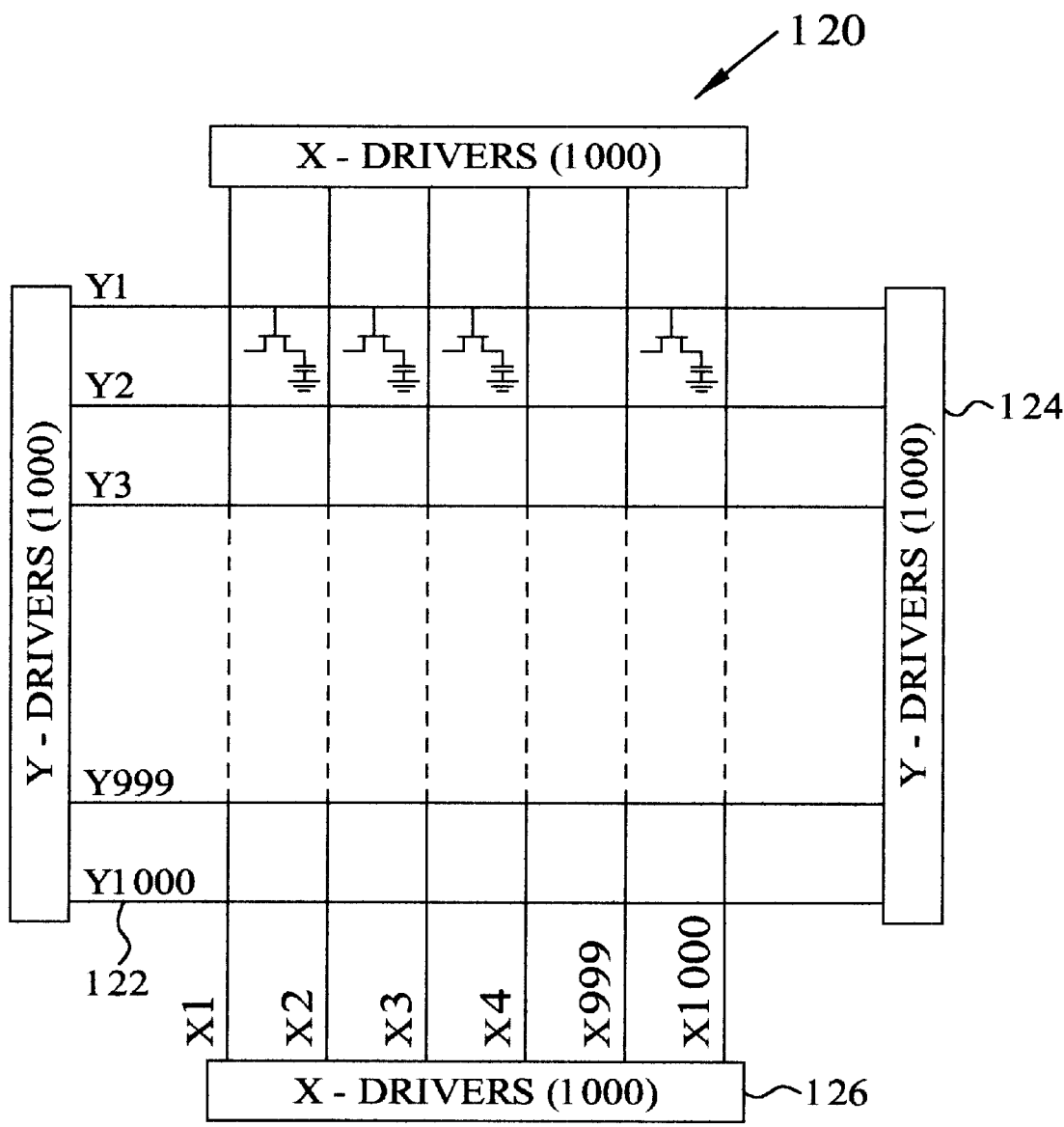
FIG. 4 schematically depicts a plurality of picture elements comprising the display.

FIG. 4 schematically depicts a plurality of picture elements comprising display (or light valve) 120. In this embodiment, one million pixels are arranged in a 1000× 1000 array 122 with row driver circuitry 124 and column 126 driver circuitry electrically connected to the pixels of the array.

FIGS. 5A, 5B, 5C, 5D, 5E, 5F, 5G and 5H schematically show the integrated fabrication process for the nematic liquid crystal display or light valve and its associated circuitry. The general method for fabricating the ultra-high resolution display or light valve system in UTSOS allows the monolithic simultaneous fabrication of the display as well as all associated electronics as schematically shown in FIG. 1.

For clarity and for purposes of demonstration, only the simplest picture element or pixel is shown which includes a single nonlinear circuit element, a low leakage MOSFET, and a single nematic liquid crystal capacitor. When following the process steps detailed below, a plurality or multitude of such pixels can be configured and interconnected with drive and image processing circuitry using appropriately designed photolithographic masks.

Figure 5A:
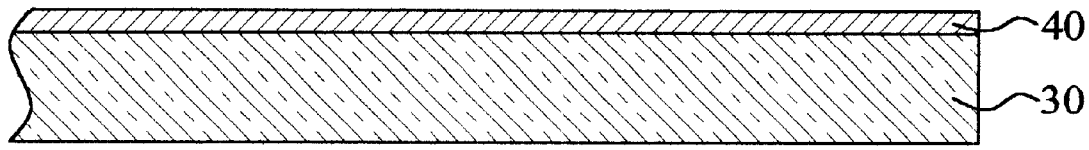
FIGS. 5A, 5B, 5C, 5D, 5E, 5F, 5G and 5H schematically show the integrated fabrication process for the nematic liquid crystal display and its associated circuitry.
Figure 5B:
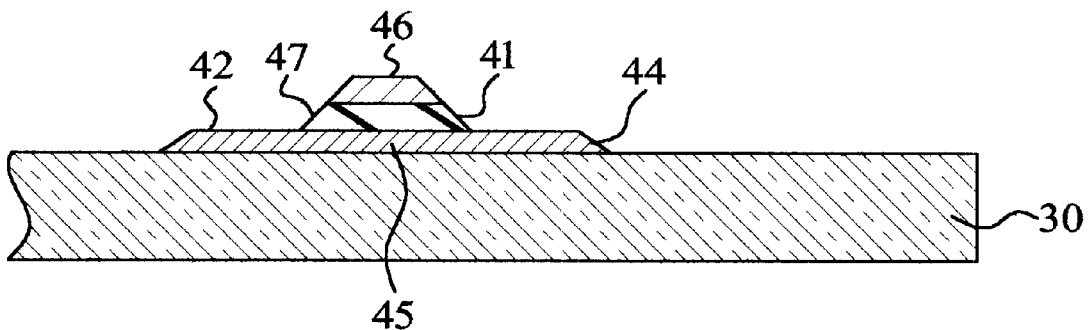

The starting material is a sapphire ($Al_2O_3$) substrate 30 in the form of a wafer commonly designated with r-plane orientation that is topped with a thin layer of single crystal, device quality silicon 40, see FIG. 5A. One method to achieve this is by epitaxial deposition of silicon by thermal decomposition of silane and subsequent ion implantation and solid phase regrowth techniques. This method uses an ion implantation of $^{28}$Si atoms (doses on the order of $10^{14}$ cm$^{-2}$ at 185 keV) into the near interfacial region of the silicon-sapphire interface (see also U.S. Pat. No. 4,177,084 cited supra., for example) while the temperature of the wafer is maintained at −20 degrees C. Ion implanting any species with a mass of about that of $^{28}$Si may also be employed without substantially changing the remaining process parameters. Species of substantially different masses such as ions or complexes of tin (Sn), germanium (Ge) or carbon (C) may also be used by appropriately varying the implant parameters.

The silicon-on-sapphire structure is thermally annealed at 900° C. in nitrogen for one hour after a soak for about 30 minutes at 550 degrees C. and a thermal ramp over the course of an hour from 550 degrees C. to 900 degrees C. The silicon is then oxidized at 1000° C. which uniformly consumes a portion of the epitaxial silicon layer. The oxide is subsequently etched leaving a thinned epitaxial silicon layer having a generally uniform, reduced thickness. The oxidation and etch process can be repeated to obtain a layer less than 100 nm thick (nominally 30 to 100 nm) of silicon, i. e. an ultrathin film of single crystal device quality silicon on sapphire. This starting material forms the basis for the optical, mechanical, electrical and thermal advantages over the prior art. In particular, a salient feature resulting from the fabrication of the display in less than 100 nm thick silicon films rather than thick films (>100 nm) of silicon-on-sapphire as taught in the prior art offers substantial improvement in absorption (i.e. increased brightness), resistance to heating and parasitic photo excited carriers.

Next, the single nonlinear circuit element, a MOSFET, is fabricated in each pixel on the thin film silicon layer. In the preferred embodiment, the pixel MOSFET width is sized to achieve the desired low leakage to achieve satisfactory gray levels with nematic liquid crystals. Simultaneously, a plurality of MOSFETs and related circuit elements are fabricated forming the associated circuits using suitably designed photolithographic masks. A series of fabrication steps that are a modification of a conventional self-aligned thin film transistor fabrication process for a MOSFET is employed. The series includes: patterning a first portion of the thin film silicon layer (using lithographic and etching techniques), growing a gate oxide by exposing the wafer to an oxygen ambient at an elevated temperature, depositing polysilicon (i.e. polycrystalline silicon) by chemical vapor deposition (CVD), doping the polysilicon, patterning the polysilicon and gate oxide to form the gate region (by similar lithographic and etch techniques used above), selectively doping the source and drain regions of the MOSFETs by ion implanting and annealing at elevated temperatures, and depositing and patterning of an oxide layer to form a sidewall oxide, which results in the self-aligrned structure seen in FIG. 5B. The doped polysilicon is a conductive material which forms the gate electrode. This MOSFET structure contains the gate oxide 41, source region 42, drain region 44, channel region 45, gate electrode 46 and sidewall oxide 47.

At this stage improved contacts may be formed, if desired, using silicidation techniques. This involves depositing a suitable metal, e.g. titanium, and rapid thermal annealing of the wafer which provides for the formation of a low resistivity metal silicide contact in the areas where the metal was in contact with polysilicon (the source and drain regions of the MOSFETs) and the gate electrode. The metal which is not in contact with polysilicon and the gate electrode is unreacted, and subsequently etched from the wafer.

Figure 5C:
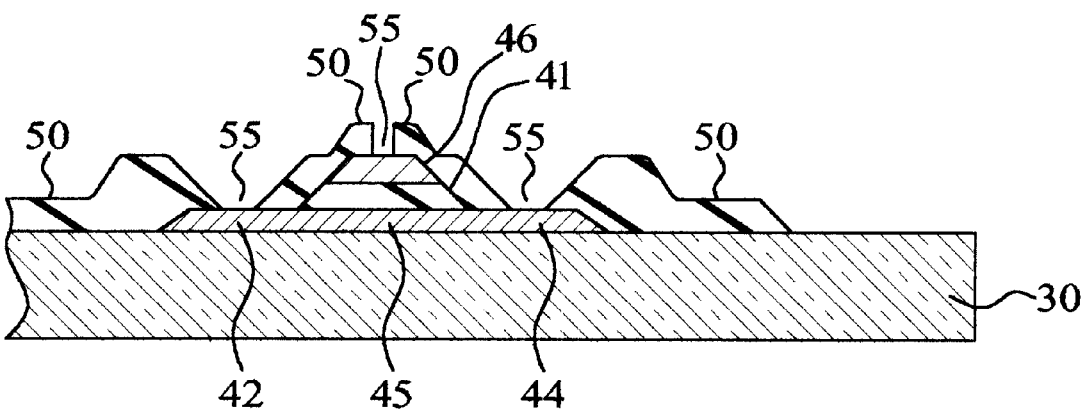
Figure 5D:
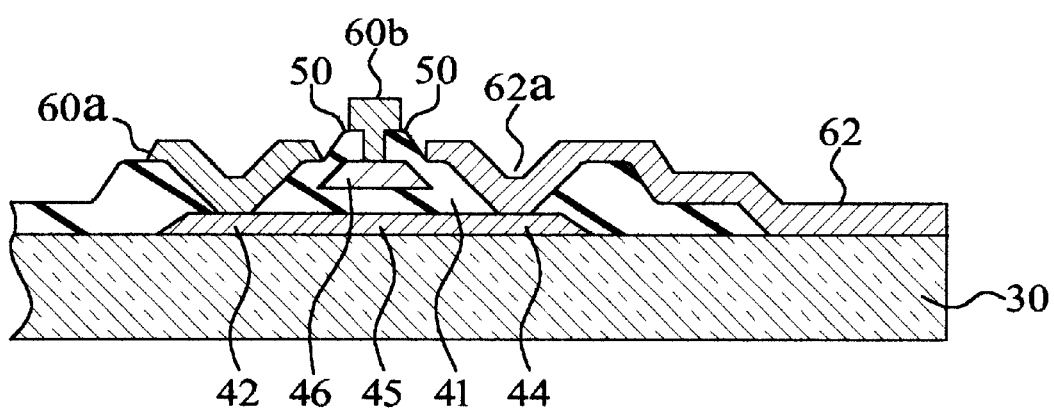
Figure 5E:
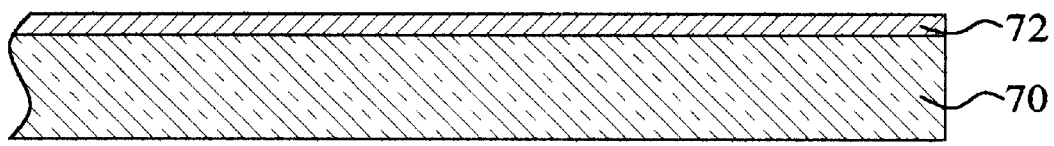
Figure 5F:
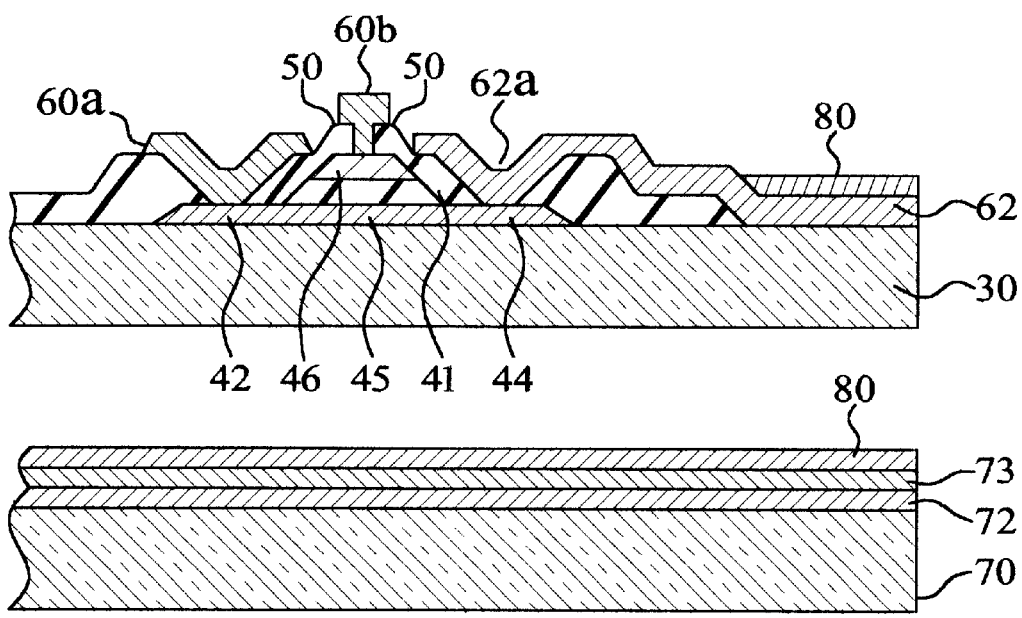
Figure 5G:
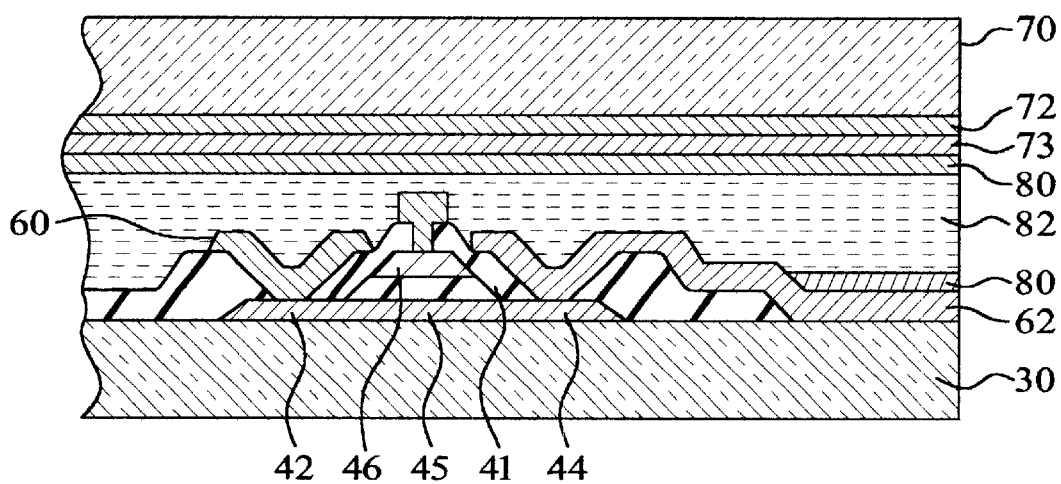

The process continues with depositing passivation oxide 50 by CVD and patterning contact holes 55 in the oxide to make contact with the source region 42, drain region 44 and gate region (via gate electrode 46), see FIG. 5C. Depositing and patterning interconnect metallization follows with the resulting structure shown in FIG. 5D. The interconnect metallization may itself be the product of a multiple step process. For example, an aluminum alloy (99%Al:1%Si) may be deposited and patterned for all contacts including source contact 60a, gate contact 60b, and interconnections with the silicon MOSFETs and related devices and circuits. A transparent conductive material such as indium tin oxide (ITO) may be subsequently deposited and patterned as a transparent drain contact 62a that also extends as a transparent nematic liquid crystal capacitor contact or electrode 62 for a nematic liquid crystal capacitor to be described, (the interconnect metallization also forms the output electrode from the MOSFET to pixel electrode 62). The transparent nematic liquid crystal capacitor electrode 62 is required when the display system 10 is used in a transmissive mode. However, for a reflective mode display or light-valve system, the nematic liquid crystal capacitor electrode may be an opaque metal (such as Al or 99%Al:1%Si) as this forms a back reflector for the system. In such an embodiment, the spacing between the nematic liquid crystal capacitor electrodes is appropriately modified to accommodate the desired path length in the liquid crystal medium. Adjusting the spacing of the capacitor electrodes is practiced in the art of liquid crystal displays.

At this stage of the process, the monolithically integrated circuitry and the MOSFETs at each pixel are completely fabricated and may, if desired, be covered with additional passivation, shielding or planarization layers useful in certain applications. A corresponding transparent substrate 70, e.g. sapphire, quartz, fused silica or glass, also is covered with a transparent metallized counter electrode 72, and appropriately patterned if desired, see FIG. 5E. This counter electrode is normally common for the entire pixel array. Looking to FIG. 5F, if desired, a means for colored display 73 may be included, for example by attachment of a colored filter, or incorporation of a colored dye and the like on the counter electrode (or alternately on the substrate with the circuitry). Alignment layers 80 are then formed on the pixel electrodes, if desired. This can entail the deposition of a thin layer of polyimide which is subsequently mechanically rubbed to obtain a preferred orientation for the liquid crystal media. The process for forming alignment layers is well known in the art of liquid crystals and variations are readily accommodated by this fabrication process.

Figure 5H:
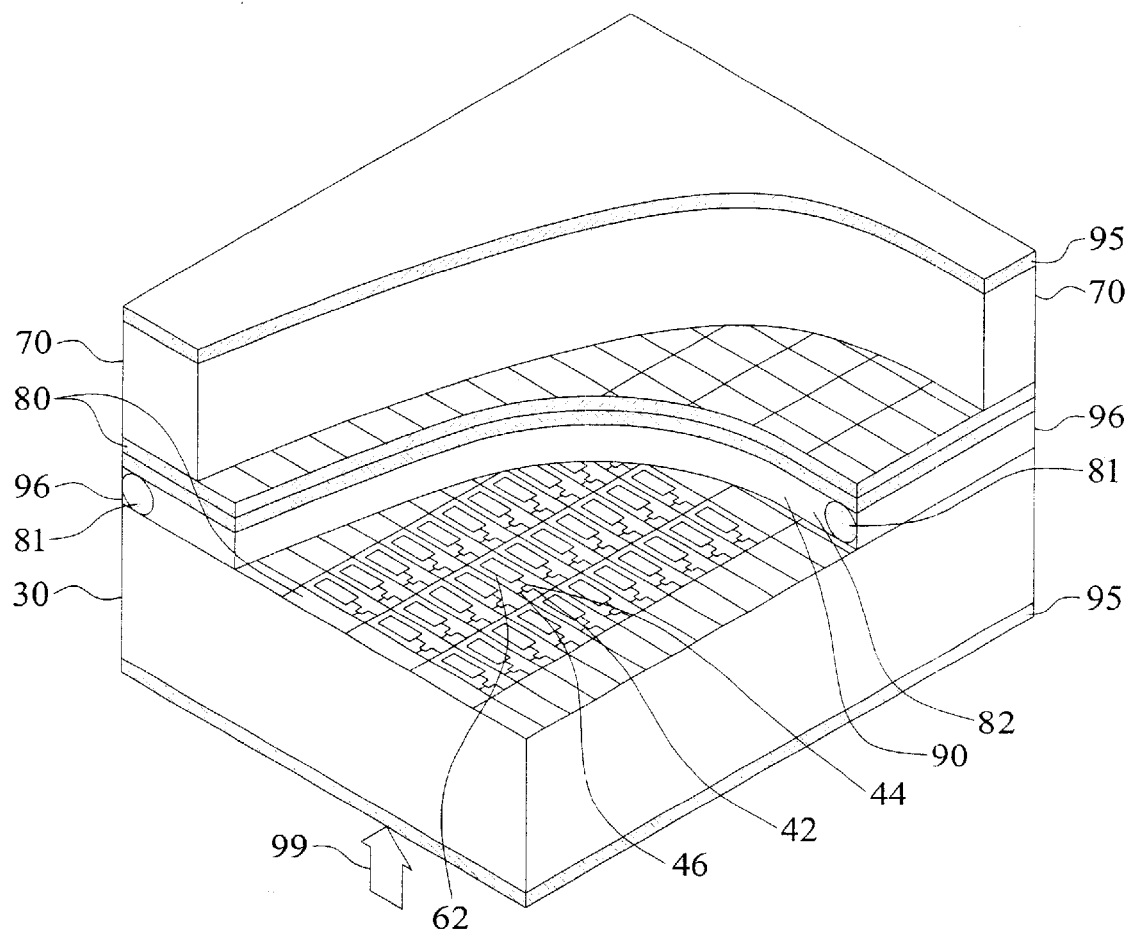

A means to appropriately space each pixel electrode 62 from counter electrode 72 is provided using, for example, fiber glass spacer rods or beads 81, see FIG. 5H such as practiced in the art. This spacer means normally lies at the periphery of the chip. Final assembly requires appropriately adjoining of substrate 30 at its respective appropriate predetermined portions with substrate 70 at its respective appropriate predetermined portions forming a cavity 82, vacuum filling of the cavity with desired liquid crystal material 90, and hermetically sealing or plugging the cavity, schematically depicted by the flat closures 96, it being understood that this configuration is for the purposes of demonstration only, see FIG. 5G and FIG. 5H.

The nematic liquid crystal material used to fill the cavity is any of those that is practiced in the art. Affixing appropriately oriented polarizers 95 to the front and back surfaces finalizes the fabrication of the monolithic display system (See cutaway plan-view in FIG. 5H which shows a plurality of the pixels arrayed in the form of a display). The polarizers are oriented to accommodate the birefringence of the sapphire substrate.

The display described above may be used for a direct view application such as in a headmounted system or as a viewfinder on a camcorder. For a projection system this array could be used as a light valve. A light blocking layer or other means for blocking light may be fabricated above the switching transistor to shield the transistor from most of the light and thereby lower the photo-induced leakage current. This, however, could be eliminated if the job at hand does not require a high brightness image. Both transmissive and reflective mode displays or light valves can be readily fabricated by the teachings herein and can be accommodated for the particular job at hand as described above.

The above teachings detail the invention as a backlit or projection display with light 99 coming from one side of the display. The display area is an active-matrix display using a plurality of pixels in an array compatible with HDTV and other ultra-high resolution displays (1000×1000 pixels or more). Each pixel uses a single MOSFET fabricated in UTSOS as the nonlinear element and an adjacent nematic liquid crystal capacitor which is switched by the MOSFET. The use of time multiplexing to achieve colors or additional gray-scales may exploit future advances in high speed liquid crystals utilizing the high speed performance of UTSOS devices to drive very large displays. The small size and reliability of the MOSFET which can be fabricated in accordance with the inventive concept in ultra-thin single crystal SOS eliminates the need for redundant nonlinear elements thereby reducing the pixel size yet increasing the display brightness. Noting FIG. 1, row and column drivers 14 are integrated in the UTSOS wafer 11 adjacent to display area 12 to address the source and gate portions in the display area. These drivers consist of shift registers which sequentially clock on the signal voltage to the appropriately selected pixels. The design and architecture of shift registers are well known to those skilled in the art of electrical design, however the advantages of UTSOS provides for very high speed performance due to the elimination of parasitic capacitances from the devices to the substrate. Additional VLSI circuitry can be included monolithically on-chip (on the wafer) to control external component driving and synchronization/timing for example when using a color scheme with external time multiplexing. This is only possible due to the high quality material and high speed devices available with UTSOS.

While the herein disclosed teachings provide for circuits and devices with leakages at or below the benchmark 1 pA/micron desired for active-matrix operation with nematic liquid crystals, utilization of the herein disclosed teachings for integration of passive displays with their associated signal processing or active addressing circuitry is also envisioned. An alternative embodiment of the invention may utilize a thin film capacitor within the pixel to store charge and reduce the effects of charge leakage from the nematic liquid crystal capacitor.

Figure 6:
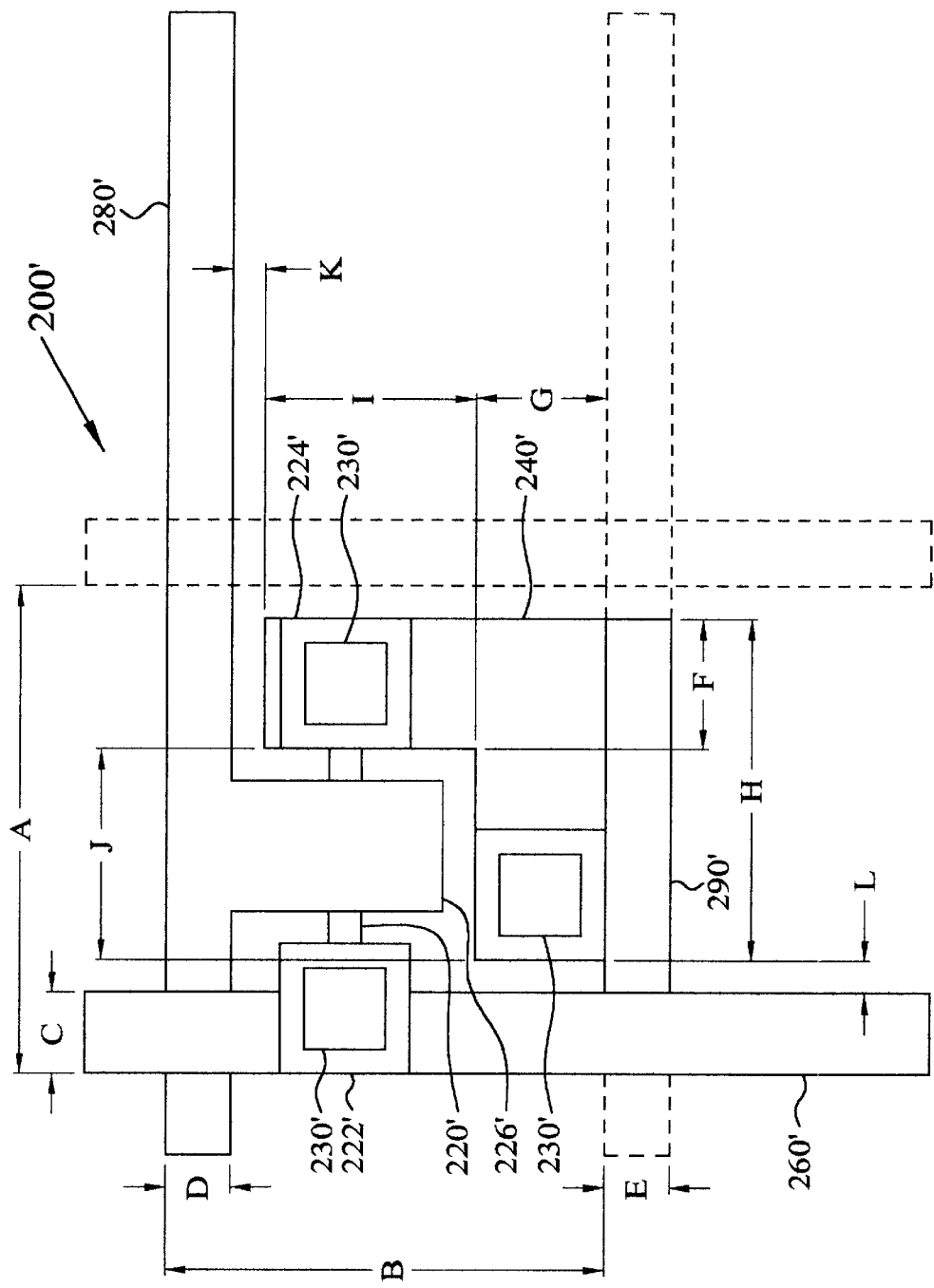
FIG. 6 shows an alternate layout scheme for a single pixel.

FIG. 6 shows in detail the layout scheme for a single pixel 200' in accordance with this invention. A capacitor structure 240' is shown with a total area of less than 53 square microns, while the MOSFET 220' covers less than 70 square microns. A 2 micron wide polysilicide gate line 280' is electrically connected to gate structure 226' of the MOSFET to turn on or off the transistor as desired. A 2 micron wide metal data line 260 is electrically connected to MOSFET source 222', while the MOSFET drain 224' is electrically connected to nematic liquid crystal capacitor structure 240'. Two micron contact holes 230' are used to electrically couple these structures together. Nematic liquid crystal capacitor structure 240' contains the nematic liquid crystal material (not shown in this figure) that undergoes variable switching in response to voltages applied to the capacitor structure that is consequently formed between laminae of the structure. This pixel architecture modification uses the additional thin film capacitor 290' in each pixel of the active-matrix array. This thin film capacitor is used to store sufficient charge to maintain the gray-level (or color) of the nematic liquid crystal capacitor even if the nonlinear electrical element (MOSFET) in the active-matrix leaks charge. This storage capacitor is designed to have high capacitance, but not be prohibitive in size such that it has detrimental effect on the aperture ratio on the display or light-valve. In this design, the thin film storage capacitor has dimensions of 8.8 $\mu$m×2 $\mu$m. The storage capacitor may use any high dielectric material such as silicon dioxide, silicon nitride, silicon oxynitride, ceramic ferroelectrics such as barium strontium titanate (BST) and the like. This advantage is amenable with future advances in high speed nematic liquid crystal materials. Note, MOSFET 220' shown in FIG. 6 has a width of 3 $\mu$m. This is larger in dimension and has a corresponding higher electrical leakage (which scales with device width) than MOSFET 220 in FIG. 3. The improved pixel architecture provided by thin film capacitor 290' in FIG. 7 allows design improvements when high drive currents offered by the wider MOSFET are desired by the job at hand but one must mitigate leakage for nematic liquid crystal applications.

Obviously, numerous modifications and variations of the present invention are possible in light of the above teachings. It is therefore understood that within the scope of the appended claims the invention may be practiced otherwise than as specifically described herein.

We claim:

1. A method for fabricating a monolithically integrated liquid crystal array display and control circuitry on a silicon-on-sapphire structure, comprising the steps of:

a) forming an epitaxial silicon layer on a sapphire substrate to create a silicon-on-sapphire structure;

b) ion implanting said epitaxial silicon layer with a species selected from the group consisting of silicon ions, tin ions, germanium ions, and carbon ions to create an ion implanted epitaxial silicon layer;

c) annealing said silicon-on sapphire structure;

d) oxidizing said ion implanted epitaxial silicon layer to form a silicon dioxide layer from a portion of said epitaxial silicon layer so that a thinned ion implanted epitaxial silicon layer remains;

e) removing said silicon dioxide layer to expose said thinned ion implanted epitaxial silicon layer;

f) fabricating transistors wherein each of said transistors is formed by patterning said thinned ion implanted epitaxial silicon layer to create a patterned epitaxial silicon layer growing a gate oxide on said patterned epitaxial silicon layer; forming a polysilicon layer over said silicon-on sapphire structure; doping said polysilicon layer; patterning said polysilicon layer and said gate oxide to form a gate region and to expose selected regions of said epitaxial silicon layer; ion implanting said selected regions of said epitaxial silicon layer to create source and drain regions in said epitaxial silicon layer that are self-aligned with said gate region;

g) fabricating electrical contacts that are electrically connected to said transistors; and h) fabricating liquid crystal capacitors on said silicon-on sapphire structure that are electrically connected to said transistors by said electrical contacts.

2. The method of claim 1 wherein said thinned epitaxial silicon layer has a generally uniform thickness no greater than about 100 nanometers.

3. The method of claim 1 wherein said transistors include nonlinear circuit elements.

4. The method of claim 1 wherein said liquid crystal capacitors include nematic liquid crystal capacitors.

5. The method of claim 1 wherein each of said transistors has a leakage current, $I_L$, where $I_L \leq 1$ pA/w, and w represents a micron of width of said transistor.

6. The method of claim 1 further includes fabricating polarizers on said silicon-on-sapphire structure.

7. The method of claim 6 further includes forming a layer of optical filters on said silicon-on sapphire structure.

8. The method of claim 1 includes the steps of:
implanting said silicon ions at a dosage of about $10^{14}$ cm$^{-2}$, at an energy level of about 185 keV and, at a temperature of about −20° C.;
immersing said silicon-on-sapphire structure in a nitrogen atmosphere having a temperature of about 550° C. for approximately 30 minutes;
increasing the temperature of said nitrogen atmosphere in which said silicon-on-sapphire structure is immersed from about 550° C. to about 900° C. in about one hour;
annealing said silicon-on sapphire structure in said nitrogen atmosphere for about one hour at 900° C.; and
oxidizing said epitaxial silicon layer in an oxygen atmosphere having a temperature of about 1000° C.

9. A method for fabricating a monolithically integrated liquid crystal array display and control circuitry on a silicon-on-sapphire structure, comprising the steps of:
a) forming an epitaxial silicon layer on a sapphire substrate to create a silicon-on-sapphire structure;
b) ion implanting silicon ions into said epitaxial silicon layer at a dosage of about $10^{14}$ cm$^{-2}$, at an energy level of about 185 keV, and at a temperature of about −20° C. to create an ion implanted epitaxial silicon layer;
c) immersing said silicon-on-sapphire structure in a nitrogen atmosphere having a temperature of about 550° C. for approximately 30 minutes;
d) increasing the temperature of said nitrogen atmosphere in which said silicon-on-sapphire structure is immersed from about 550° C. to about 900° C. in about one hour;
e) annealing said silicon-on sapphire structure in said nitrogen atmosphere for about one hour at 900° C.; and
f) oxidizing said ion implanted epitaxial silicon layer in an oxygen atmosphere having a temperature of about 1000° C. to form a silicon dioxide layer from portion of said ion implanted epitaxial silicon layer so that a thinned ion implanted epitaxial silicon layer remains;
g) removing said silicon dioxide layer to expose said thinned ion implanted epitaxial silicon layer;
h) fabricating transistors wherein each of said transistors is formed by patterning said thinned ion implanted epitaxial silicon layer to create a patterned epitaxial silicon layer; growing a gate oxide on said patterned epitaxial silicon layer; forming a polysilicon layer over said silicon-on sapphire structure: doping said polysilicon layer; patterning said polysilicon layer and said gate oxide to form a gate region and to expose selected regions of said epitaxial silicon layer; ion implanting said selected regions of said epitaxial silicon layer to create source and drain regions in said epitaxial silicon layer that are self-aligned with said gate region;
i) fabricating electrical contacts that are electrically connected to said transistors; and
j) fabricating liquid crystal capacitors on said silicon-on-sapphire structure that are electrically connected to said transistors by said electrical contacts.

10. The method of claim 9 wherein said thinned epitaxial silicon layer has a generally uniform thickness no greater than about 100 nanometers.

11. The method of claim 9 wherein said transistors include nonlinear circuit elements.

12. The method of claim 9 wherein said liquid crystal capacitors include nematic liquid crystal capacitors.

13. The method of claim 9 further includes fabricating polarizers on said silicon-on-sapphire structure.

14. The method of claim 9 further includes forming a layer of optical filters on said silicon-on sapphire structure.

15. A method for fabricating a monolithically integrated liquid crystal array display and control circuitry on a silicon-on-sapphire structure, comprising the steps of:
a) forming an epitaxial silicon layer on a sapphire substrate to create a silicon-on-sapphire structure;
b) ion implanting said epitaxial silicon layer with a species selected from the group consisting of silicon ions, tin ions, germanium ions, and carbon ions to create an ion implanted epitaxial silicon layer;
c) annealing said silicon-on sapphire structure;
d) oxidizing said ion implanted epitaxial silicon layer to form a silicon dioxide layer from a portion of said epitaxial silicon layer so that a thinned ion implanted epitaxial silicon layer remains;
e) removing said silicon dioxide layer to expose said thinned ion implanted epitaxial silicon layer;
f) fabricating transistors wherein each of said transistors is formed by patterning said thinned ion implanted epitaxial silicon layer to create a patterned epitaxial silicon layer, growing a rate oxide on said patterned epitaxial silicon layer; forming a polysilicon layer over said silicon-on sapphire structure; doping said polysilicon layer; patterning said polysilicon layer and said gate oxide to form a gate region and to expose selected regions of said epitaxial silicon layer; ion implanting said selected regions of said epitaxial silicon layer to create source and drain regions in said epitaxial silicon layer that are self-aligned with said gate region;
g) fabricating electrical contacts that are electrically connected to said transistors; and
h) fabricating liquid crystal capacitors on said silicon-on sapphire structure that are electrically connected to said transistors by said electrical contacts, wherein said liquid crystal capacitors include liquid crystal material, said electrical contacts, and a metalized counter electrode, wherein said liquid crystal material is interposed between said self-aligned transistors, said electrical contacts, and said metalized counter electrode.

16. A method for fabricating a monolithically integrated liquid crystal array display and control circuitry on a silicon-on-sapphire structure, comprising the steps of:
a) forming an epitaxial silicon layer on a sapphire substrate to create a silicon-on-sapphire structure;
b) ion implanting silicon ions into said epitaxial silicon layer at a dosage of about $10^{14}$ cm$^{-2}$, at an energy level of about 185 keV, and at a temperature of about −20° C. to create an ion implanted epitaxial silicon layer;
c) immersing said silicon-on-sapphire structure in a nitrogen atmosphere having a temperature of about 550° C. for approximately 30 minutes;
d) increasing the temperature of said nitrogen atmosphere in which said silicon-on-sapphire structure is immersed from about 550° C. to about 900° C. in about one hour;

e) annealing said silicon-on sapphire structure in said nitrogen atmosphere for about one hour at 900° C.; and f) oxidizing said ion implanted epitaxial silicon layer in an oxygen atmosphere having a temperature of about 1000° C. to form a silicon dioxide layer from portion of said ion implanted epitaxial silicon layer so that a thinned ion implanted epitaxial silicon layer remains;

g) removing said silicon dioxide layer to expose said thinned ion implanted epitaxial silicon layer;

h) fabricating transistors wherein each of said transistors is formed by patterning said thinned ion implanted epitaxial silicon layer to create a patterned epitaxial silicon layer; growing a gate oxide on said patterned epitaxial silicon layer; forming a polysilicon layer over said silicon-on sapphire structure; doping said polysilicon layer; patterning said polysilicon layer and said gate oxide to form a gate region and to expose selected regions of said eritaxial silicon layer; ion implanting said selected regions of said epitaxial silicon layer to create source and drain regions in said epitaxial silicon layer that are self-aligned with said gate region;

i) fabricating electrical contacts that are electrically connected to said transistors; and j) fabricating liquid crystal capacitors on said silicon-on-sapphire structure that are electrically connected to said transistors by said electrical contacts, wherein said liquid crystal capacitors include liquid crystal material, said electrical contacts, and a metalized counter electrode, wherein said liquid crystal material is interposed between said self-aligned transistors, said electrical contacts, and said metalized counter electrode.

\* \* \* \* \*